United States Patent
Kakkad

(10) Patent No.: US 7,943,447 B2
(45) Date of Patent: May 17, 2011

(54) METHODS OF FABRICATING CRYSTALLINE SILICON, THIN FILM TRANSISTORS, AND SOLAR CELLS

(76) Inventor: Ramesh Kakkad, Hsinchu (TW)

( * ) Notice: Subject to any disclaimer, the term of this patent is extended or adjusted under 35 U.S.C. 154(b) by 162 days.

(21) Appl. No.: 12/184,525

(22) Filed: Aug. 1, 2008

(65) Prior Publication Data

US 2009/0042343 A1 Feb. 12, 2009

Related U.S. Application Data

(60) Provisional application No. 60/935,332, filed on Aug. 8, 2007.

(51) Int. Cl.
*H01L 21/00* (2006.01)
(52) U.S. Cl. .......................... 438/166; 257/70
(58) Field of Classification Search .................. 438/166, 438/486; 257/70, E21.379, E21.497
See application file for complete search history.

(56) References Cited

U.S. PATENT DOCUMENTS

| | | | |
|---|---|---|---|
| 5,147,826 A | 9/1992 | Liu et al. | |
| 5,242,507 A | 9/1993 | Iverson | |
| 5,498,904 A * | 3/1996 | Harata et al. | 257/623 |
| 5,733,804 A | 3/1998 | Hack et al. | |
| 6,162,711 A | 12/2000 | Ma et al. | |
| 6,355,544 B1 | 3/2002 | Essaian et al. | |
| 6,747,254 B2 | 6/2004 | Kim | |
| 7,078,325 B2 | 7/2006 | Curello et al. | |
| 2003/0010775 A1 | 1/2003 | Kim | |
| 2003/0124799 A1 | 7/2003 | Ping et al. | |
| 2003/0197007 A1 | 10/2003 | Kim et al. | |
| 2005/0186723 A1 * | 8/2005 | Kim | 438/200 |
| 2005/0239263 A1 | 10/2005 | Ping et al. | |
| 2006/0046504 A1 * | 3/2006 | Kayama et al. | 438/758 |
| 2006/0286780 A1 * | 12/2006 | Jang et al. | 438/482 |
| 2007/0004185 A1 | 1/2007 | Kakkad | |
| 2007/0122936 A1 | 5/2007 | Park et al. | |

OTHER PUBLICATIONS

Kagan, Cherie R. and Andry, Paul. "Thin-Film Transistors" Marcel Dekker, Inc. 2003, p. 53.
Wolford, D.J. et al. "Efficient Visible Photoluminescence in the Binary a-Si:Hx Alloy System". Appl. Phys Lett. 42 (4). p. 369-371. 1983.
Kakkad, R. et al. "Low Temperature Selective Crystallization of Amorphous Silicon." Journal of Non-Crystalline Solids 115. p. 66-68. 1989.
Miyasaka, Mitsutoshi. "In situ Observation of Nickel Metal-Induced Lateral Crystallization of Amorphous Silicon Thin Films." Applied Physics Letters, vol. 80. No. 6. pp. 944-946. 2002.
Kim, Hyoung-Jun. & Shin, Dong Hoon. "Development of Rapid Thermal Processor for Large Glass LTPS Production." IMID/IDMC '06 Digest. p. 533-536. 2006.

* cited by examiner

*Primary Examiner* — David Vu
*Assistant Examiner* — Shaun Campbell
(74) *Attorney, Agent, or Firm* — Brown & Michaels, PC

(57) ABSTRACT

The present invention includes methods to crystallize amorphous silicon. A structure including a conductive film with at least one conductive layer in thermal contact with an amorphous silicon (a-Si) layer to be crystallized is exposed to an alternating or varying magnetic field. The conductive film is more easily heated by the alternative or varying magnetic field, which, in-turn, heats the a-Si film and crystallizes it while keeping the substrate at a low enough temperature to avoid damage to or bending of the substrate. The method can be applied to the fabrication of many semiconductor devices, including thin film transistors and solar cells.

50 Claims, 5 Drawing Sheets

METHODS OF FABRICATING CRYSTALLINE SILICON, THIN FILM TRANSISTORS, AND SOLAR CELLS

REFERENCE TO RELATED APPLICATIONS

This application claims one or more inventions which were disclosed in Provisional Application No. 60/935,332, filed Aug. 8, 2007, entitled "METHODS OF FABRICATING CRYSTALLINE SILICON FILMS, THIN FILM TRANSISTORS, AND SOLAR CELLS". The benefit under 35 USC §119(e) of the United States provisional application is hereby claimed, and the aforementioned application is hereby incorporated herein by reference.

BACKGROUND OF THE INVENTION

1. Field of the Invention

The invention pertains to the field of semiconductor fabrication. More particularly, the invention pertains to methods of crystallizing amorphous silicon film and methods of forming thin film device structures such as thin film transistors and thin film solar cells incorporating the silicon film formed using such crystallization process.

2. Description of Related Art

Polycrystalline silicon (polysilicon) thin films are used in devices such as thin film transistors (TFTs) or solar cells. The polysilicon TFT arrays are used as backplanes for switching liquid crystal displays (LCDs) and for driving organic light emitting diode (OLED) displays. For the LCD applications, polycrystalline TFTs are used instead of more popular amorphous silicon (a-Si) TFTs when the peripheral driving circuit is also made using TFTs, since polysilicon TFTs have about two orders of magnitude higher carrier mobility compared to a-Si TFTs. Additionally, for higher resolutions LCDs, polysilicon TFTs are preferred over a-Si TFTs. For OLED applications, currently the use of polysilicon TFTs is the only practical way to make reliable displays, as instability of a-Si TFTs makes long term OLED operation difficult.

In polysilicon TFTs, the active layer (channel of TFT) is made of polycrystalline silicon. During the fabrication of polysilicon TFTs, the channel layer is usually deposited as a-Si and then it is subsequently annealed to convert it to polycrystalline silicon. This process is referred to as crystallization. The crystallization of a-Si needs to be performed at a thermal budget (temperature/time budget) lower than that which can damage the glass substrate used for the display. The most commonly used method for crystallization in the industry today is excimer laser annealing (ELA), as thermal budgets encountered during the ELA do not cause damage the glass substrate. Although the ELA process is the most commonly used method, it has several disadvantages. First of all, the ELA process is expensive in terms of cost of equipment, its operation and maintenance. Secondly, since the ELA is performed by scanning a pulsed laser beam, there is a non-uniformity in TFT characteristics resulting from pulse to pulse variation of the laser beam. The scanning non-uniformity is visible on an image of an OLED display in the form of scan lines. Additionally, there is a high surface roughness for the polycrystalline silicon layer formed using ELA. Laser annealing is not suitable for creating thicker polycrystalline films (several thousand angstroms to several micrometers) that are needed in solar cells, because laser annealing does not efficiently produce these films.

The least expensive and simplest crystallization process for a-Si is thermal annealing and it is known as solid phase crystallization (SPC). However, the thermal budgets needed to crystallize a-Si by SPC are too high to be practical for mass production of TFTs. For example, for a-Si films deposited at about 250° C. by a PECVD method, the annealing time needed to crystallize the films at 600° C. is about 15 hours. Such times are too long for mass production of devices.

The annealing times for crystallization can be reduced exponentially by increasing the temperature. For example, for the same a-Si film mentioned above, the crystallization time at 650° C. is about 80 minutes and, at 700° C., it is of the order of 10 minutes. However, the glass substrate used for these TFTs can easily bend at these thermal budgets.

In order to reduce the thermal budget for crystallization of a-Si, people have deposited very thin (10-30 angstrom) Ni or Pd films on the a-Si surface and crystallized it by a process called metal induced crystallization (MIC) at a thermal budget 100 to 150° C. lower than those needed during SPC. The crystallization in this case proceeds by formation of a crystalline silicide (example Nickel silicide). This method is very attractive because of its lower thermal budget, but during the annealing, there is an incorporation of the metals and/or their silicides into the entire silicon layer, which affects the device characteristics adversely, especially the leakage current, which increases significantly for these devices.

The amorphous silicon film deposited on a substrate such as glass can be selectively heated by generating an alternating or varying magnetic field by introducing alternating electrical current in an induction coil in the vicinity of the amorphous silicon film (U.S. Pat. No. 6,747,254, issued Jun. 8, 2004, entitled "Apparatuses for heat-treatment of semiconductor films under low temperature", incorporated herein by reference). This is done to keep the substrate at a temperature lower than the a-Si crystallization temperature, while the a-Si film is at a high enough temperature to crystallize. However, heating of the film due to the magnetic field strongly depends upon the conductivity of the film. Since the conductivity of amorphous silicon is very low (could be as low as $10^{-12}$ S/cm), the magnetic field is unable to effectively heat the a-Si film. Alternatively, a conductive susceptor can be placed under the substrate and heated by the magnetic field, but this has a disadvantage of the substrate being heated by the susceptor.

SUMMARY OF THE INVENTION

The present invention includes a method to crystallize amorphous silicon film on a substrate by selectively heating it at a temperature higher than the substrate. A structure includes a conductive film made up of one or more layers in thermal contact with an amorphous silicon (a-Si) film. The conductive film is inductively heated by an alternating or varying magnetic field. The conductive film has a higher conductivity than the a-Si film, thus the conductive film is more easily heated by the alternative or varying magnetic field. The heated conductive film in-turn heats the a-Si film and crystallizes it while keeping the substrate at a low enough temperature to avoid damage to or bending of the substrate. The conductive film may be in direct contact with the a-Si film or may be separated by a thin intermediate layer that easily allows heat transfer from the conductive film to the a-Si film. In one embodiment, the method is applied to the fabrication of thin film transistors or solar cells.

DETAILED DESCRIPTION OF THE INVENTION

Figure 1A:
FIG. 1A shows a structure to crystallize amorphous silicon in an embodiment of the present invention.
Figure 1B:
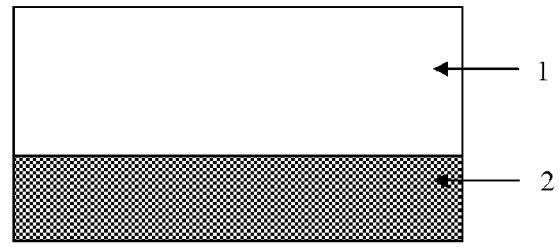
FIG. 1B shows another structure to crystallize amorphous silicon in an embodiment of the present invention.
Figure 1C:
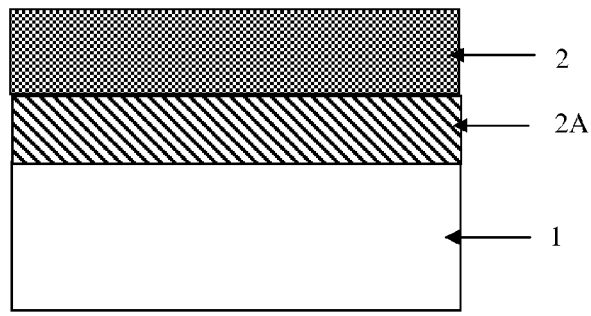
FIG. 1C shows another structure to crystallize amorphous silicon in an embodiment of the present invention.
Figure 7A:
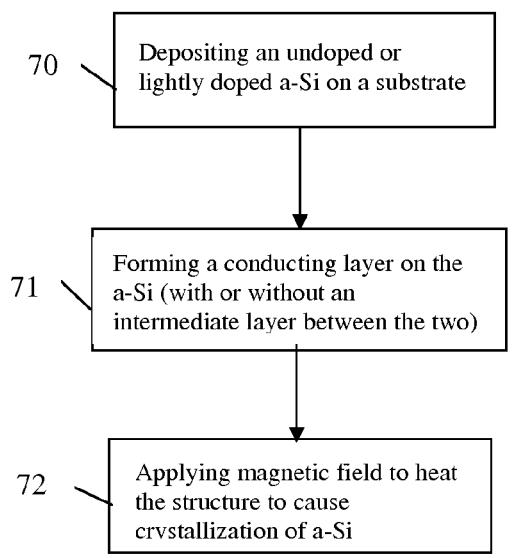
FIG. 7A shows a flow chart of an embodiment of a method of the present invention.

FIG. 7A shows a flowchart of a method of the present invention, as it might be used to create the structure shown schematically in FIGS. 1A and 1C. According to the method, in step 70, an a-Si film 1 (for example to be used as a channel layer of a TFT) of the desired thickness is deposited on a substrate such as glass (not shown). If needed, the a-Si film may be lightly doped, for example, for threshold voltage adjustment of the TFT, but the doping levels for this film would be very low (generally of the order of $10^{17}$ cm$^{-3}$). Thus, this film can be referred to as an undoped a-Si film or just an a-Si film. In step 71, a conductive film 2 is deposited on the a-Si film (FIG. 1A.) In step 72, a magnetic field is generated by passing current or varying current in an induction coil placed in the vicinity of the structure. The magnetic field is preferably an alternative magnetic field or a varying magnetic field. This will raise the temperature of the conductive film by induction heating. The power imparted by the magnetic field increases with the conductivity, thus a higher power would be imparted to the conductive film compared to lower conductivity films such as the a-Si films. This will cause the conductive film to heat up to a higher temperature. The heat will be transferred from the conductive film to the a-Si film, leading to crystallization of the a-Si film. The glass substrate can be kept at a lower temperature as its conductivity is very low.

Figure 1D:
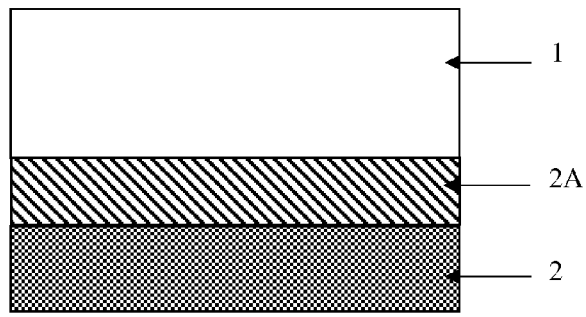
FIG. 1D shows another structure to crystallize amorphous silicon in an embodiment of the present invention.

Some embodiments of the present invention use an intermediate layer 2A between the conductive film and the a-Si film as shown in FIGS. 1C and 1D. Some reasons to include an intermediate layer 2A include, but are not limited to, to protect the amorphous silicon from environmental impurities or from environmental reaction, to prevent impurities from the conductive film 2 from entering into the silicon film 1, or to stop a possible reaction between the conductive film 2 and the a-Si film 1. The intermediate layer could be a part of device structure such as a gate insulator layer (for example, a silicon oxide layer or a silicon nitride layer) in a thin film transistor structure or it could be an additional layer, which may be removed later if not necessary for the final structure. In other embodiments, a barrier layer (not shown) may be in between the substrate and the a-Si film 1 to minimize the contamination from the substrate into the a-Si film 1 and also to increase the temperature difference between the a-Si film 1 and the substrate to further minimize the bending or deformation of the substrate.

During the above mentioned crystallization process, the substrate can also be heated with a heating apparatus including, but not limited to, a resistance-heated furnace or one or more lamps to aid the crystallization process. In this case, the temperature of the substrate can be controlled such that the temperature does not get high enough to cause the substrate to substantially bend or become otherwise damaged.

Figure 7B:
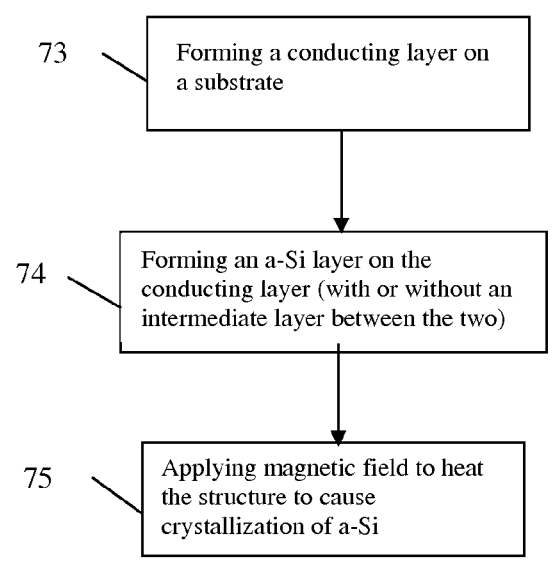
FIG. 7B shows a flow chart of another embodiment of a method of the present invention.

The conductive film can be located above, below or both above and below the a-Si film. In the case where the conductive film is located below the a-Si film, as shown in the flow chart in FIG. 7B and schematically shown in FIGS. 1B and 1D, first a conductive film 2 is deposited in step 73. Subsequently, an amorphous silicon film 1 is deposited in step 74. Then, the magnetic field crystallization is carried out as described above (step 75). If needed, an intermediate film 2A can be deposited between the a-Si film and the conductive film, as shown in FIG. 1D.

The conductive film may be a film including, but not limited to, a carbon film, graphite film, a doped a-Si or doped microcrystalline silicon film, transparent conductor films such as ITO or IZO or a stack of two or more of these films. The conductive film may contain Fe. The conductive film may be a magnetic film. A metal film may be used as the conductive film in direct contact with the a-Si film if it does not react with the a-Si film or cause any impurities to be incorporated into the a-Si that can cause undesirable deterioration of the properties of the crystallized film or deterioration in the characteristics of the device fabricated using the crystallized film. A metal layer can be used as the conductive film if an intermediate layer is kept between the a-Si layer and the conductive film. When a doped film is used as the conductive film, the dopants are preferably from group III or group V elements of the periodic table. Since heavily doped a-Si films can be more easily crystallized compared to undoped a-Si films, the doped film not only provides heat to the undoped film during the crystallization process, but also acts as a crystallization seed for the a-Si film in contact with it, since the crystal seeds will first begin to form in the doped silicon film. This is advantages since a doped silicon film not only heats provides the heat, but also speeds up the crystallization process by facilitating seeding or nucleation process of a-Si crystallization. This seeding process also improves the crystalline quality of the resulting crystallized film. When a doped a-Si film is used as the conductive film, the preferred conductivity value for the doped film is $10^{-3}$ S/cm or higher.

After the crystallization of the a-Si film is carried out, the conductive film can be removed completely. Alternatively, the conductive film may be removed selectively from some parts or it can be left in the device as a device application requires. When an intermediate layer is present in the structure, the intermediate layer may similarly be removed completely, removed selectively, or remain on the structure. For the sake of convenience, this process will be referred to as magnetic field crystallization herein.

When a doped silicon film is used as the conductive film, the doped film may be produced by incorporating dopant atoms into silicon during the deposition (gas phase doping) or it may be formed on top of the a-Si film (to be crystallized) by implanting dopant atoms in a-Si. Generally for the doped film case, the dopant concentration needs to be higher than $10^{18}$ $cm^{-3}$. Preferably, the dopant concentration is higher than $10^{20}$ $cm^{-3}$. When the doped a-Si conductive film is in direct contact with the a-Si film, it can also act as a crystallization seed as it can crystallize faster. In this case, a boron doped a-Si film is preferred as it crystallizes faster than other a-Si films doped with other dopants.

The thickness of the conductive film is preferably from about 50 angstroms to several thousand angstroms. The intermediate layer is preferably several 10s of angstroms to several 1000s of angstroms thick. The heat transfer from the conductive film to the a-Si film would depend upon the thickness and thermal conductivity of the intermediate layer, with a thinner film and/or a film a higher thermal conductivity being preferred for efficient heat transfer.

The crystallization times for the methods of the present invention depend upon the thickness of the undoped a-Si film (to be crystallized), with thicker films requiring correspondingly longer times. Also, the thickness and conductivity of the conductive film would affect the crystallization time, with a higher value of either thickness or conductivity leading to a reduction in crystallization time of the a-Si film.

When a doped silicon film is used as a conducting layer, it can be etched away after the crystallization. The doped film can be etched away entirely from the top of the undoped a-Si film or it can be selectively etched. For example, it can be etched away only over the channel region while leaving it in source-drain areas for making contacts to TFTs. If the doped layer is entirely etched, either p-channel or n-channel TFTs can be formed by p-type or n-type doping of the source-drain regions of TFTs, respectively. If the doped layer is kept in the source and drain areas, only one type of TFT can be fabricated consistent with the conductivity type of the doped layer. The latter is a simpler process as additional steps for doping source-drain regions are not needed.

The crystallization thermal budgets can be further reduced if the proposed crystallization process is performed in an oxidizing ambient. $O_2$ or $H_2O$ ambient may be used as the oxidizing ambient. At higher pressures, the oxidation rates are faster, thus crystallization thermal budgets can be even further reduced if high pressures are used in combination with an oxidizing ambient.

TFT Application Example 1

Inverted Staggered TFT Structure

This example applies the crystallization methods of the present invention to a bottom-gate type TFT.

Figure 2:
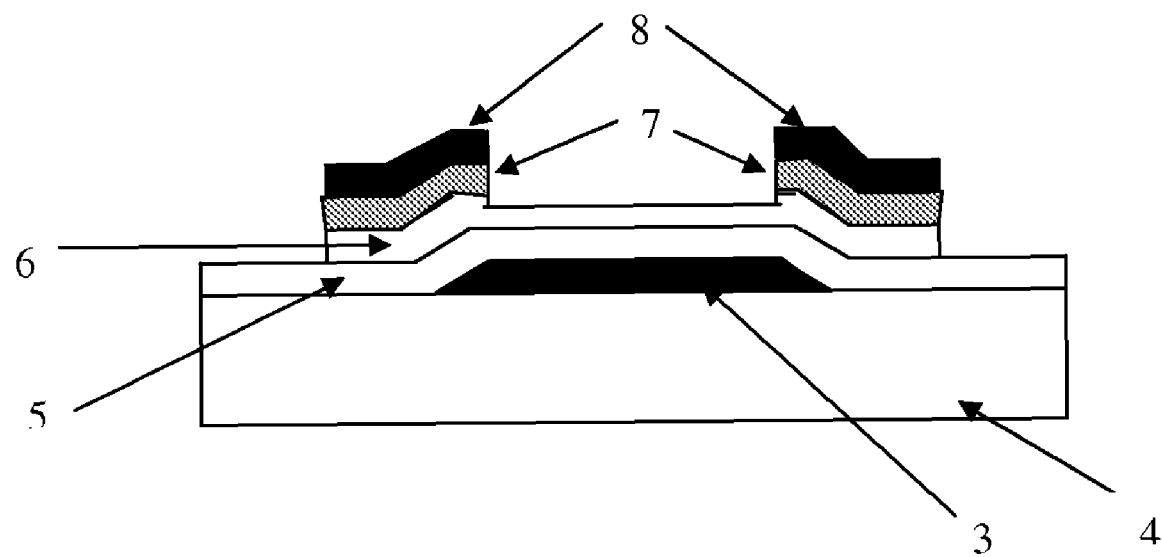
FIG. 2 is a schematic of a inverted-staggered (bottom-gate) TFT structure fabricated with the silicon channel layer crystallized according to a method of the present invention.

As shown in FIG. 2, a gate-electrode layer 3 is deposited and patterned on a substrate 4. The substrate 4 may optionally have a barrier layer (not shown) on top of it. A gate-insulator layer 5 is deposited on the gate-electrode layer 3. Materials to use for the gate-insulator layer include, but are not limited to, silicon dioxide, silicon nitride or a stack of silicon dioxide and silicon nitride layers or any other insulating material. On the gate insulator layer 5, an undoped amorphous silicon layer 6 is deposited on the gate-insulator layer 5 without breaking the vacuum. The undoped amorphous silicon layer 6 is the active layer or channel layer to be crystallized. Magnetic field crystallization can be carried out at this stage in fabrication, as the gate-electrode layer 3 can be efficiently heated by the magnetic field. Additionally, the substrate may optionally be heated by other means (such as furnace, or lamps) to aid the crystallization process. Instead of employing the magnetic field crystallization of amorphous silicon at this stage, it is also possible to employ it at a later stage in the TFT processing, as discussed further below.

A doped silicon layer 7, which is preferably a doped a-Si or a doped microcrystalline silicon layer, is formed by deposition on the channel silicon layer 6. A doped a-Si layer 7 is preferably formed by gas phase doping or by ion implantation or ion doping. The doped layer 7 may be formed continuously or it can be formed discontinuously, for example, formed on source-drain areas but not on channel areas of TFTs. The crystallization of the a-Si layer 6 by the magnetic field may be carried out at this stage in fabrication instead of at the earlier stage mentioned above. If the crytallization is carried out at this stage, the gate-electrode layer 3, as well as the doped silicon layer 7, will help in crystallization. The crystallization of the a-Si layer 6 is further sped up by seeding from the doped silicon layer 7, as was discussed earlier. The doped silicon layer 7 alone can cause crystallization of the a-Si layer 6, if the heat-transfer from the gate electrode layer 3 is not efficient due to lower thermal conductivity and/or higher thickness of the gate insulator layer 5. The gate insulator materials used in TFTs generally have low thermal conductivities and generally are thick enough to prevent efficient heat flow from a gate electrode layer to an a-Si layer, thus application of the magnetic field crystallization would be beneficial if performed after deposition of a doped or a conductive layer on the a-Si layer.

The doped layer 7 and the channel silicon layers 6 are preferably patterned simultaneously to form silicon islands to electrically isolate devices from each other. A source drain electrode layer is deposited on this structure. It is also possible to use the magnetic field crystallization process at this stage. The source drain electrode layer, the doped silicon layer 7 and the gate-electrode layers all can be heated by the magnetic field to help crystallize the a-Si layer 6. The source drain electrode layer is patterned to form source and drain patterns 8 and the source-drain electrode layer and the doped silicon layers 7 are etched away from above the active layer 6 of the TFTs as shown in FIG. 2.

FIG. 2 shows the TFT structure fabricated using the process described so far. One or more additional passivation layers such as silicon nitride and/or one or more pixel electrode layers such as indium tin oxide (ITO) or indium zinc oxide (IZO) layers may be added to complete the TFT arrays. Pixel electrode layers are conductive layers and magnetic field crystallization may also be carried out after deposition of a pixel electrode layer instead of at any of the earlier stages. The pixel electrode layer is preferably subsequently patterned. A passivation silicon nitride layer may be used as source of hydrogen to passivate the polysilicon grain boundaries in order to improve the performance of the TFTs.

TFT Application Example 2

Co-Planar Structure

Figure 3A:
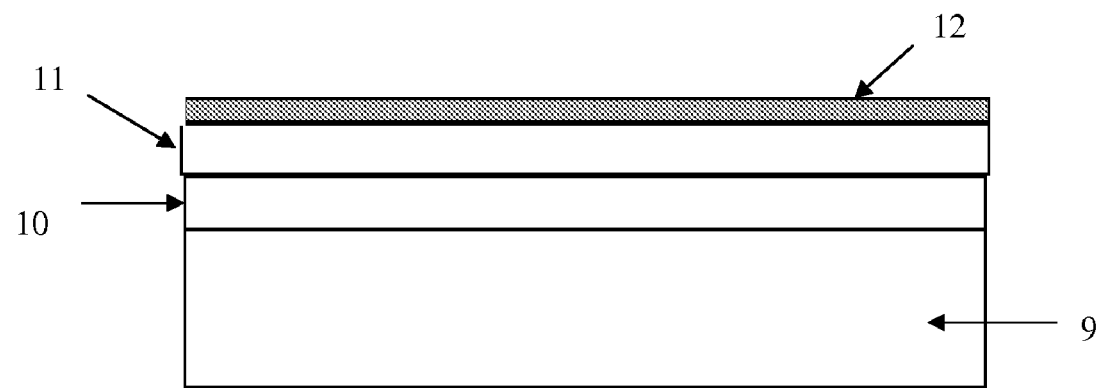
FIG. 3A shows a structure early in the fabrication process of a top-gate, co-planar TFT structure incorporating the silicon channel layer crystallized by a method of the present invention.
Figure 3B:
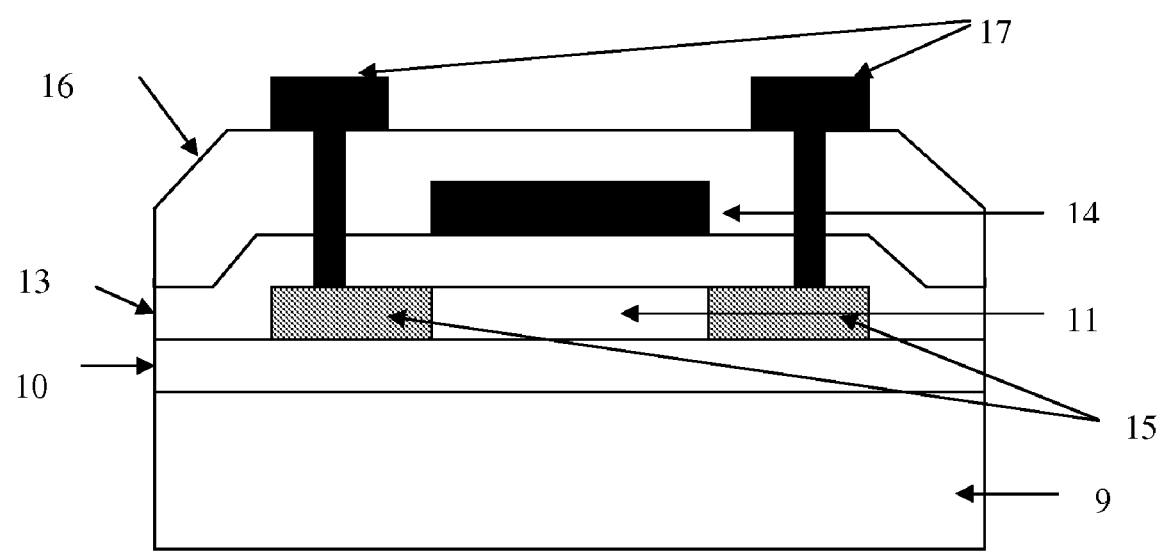
FIG. 3B depicts another structure during the fabrication process of a top-gate, co-planar TFT structure incorporating the silicon channel layer crystallized according to a method of the present invention.

FIGS. 3A and 3B show a fabrication process for a top gate TFT co-planar structure using an a-Si crystallization method of the present invention. A barrier layer 10 is deposited on a substrate 9. In one embodiment, the barrier layer 10 is made of silicon nitride. An a-Si layer 11, undoped or lightly doped, is deposited on the barrier layer 10 as the active layer. A conductive film 12 is deposited on the a-Si layer 11. If needed, an intermediate layer (not shown in the figures) may be interposed between the conductive film 12 and the a-Si layer 11. The conductive film 12 may be a film including, but not limited to, a graphite film, a doped silicon film, a metal film or a magnetic film. If the conductive film 12 is a doped silicon film, it may be a film including, but not limited to, a doped a-Si or a doped microcrystalline silicon film. Alternatively, the top part of the active layer 11 may also be doped by implanting/or diffusing dopants. Instead of placing the conductive film 12 on the top, it may alternatively be placed under the barrier layer 10. In that case, it would be preferable that the conducting film is made of a transparent conductor to allow the display light to pass through it. In that embodiment, an additional heat sink or thermally insulating layer between the substrate 9 and the conductive film 12 may also be needed to protect the substrate 9 from the heated conductive film 12.

The structure is annealed to cause crystallization of the active layer by application of the magnetic field as discussed above. When a doped silicon film is used as the conductive silicon layer 12, the crystallization of the a-Si layer 11 is further sped up by seeding from the doped silicon layer 12, as was discussed earlier. The substrate may also be heated (for example, by furnace or by lamps) to aid crystallization by the magnetic field. In this process, the entire a-Si film on a given substrate may be crystallized before any kind of patterns related to a TFT structure are formed. This is advantageous since, at high enough furnace temperature, the substrate may shrink, affecting the spacing between TFT devices, if the patterns were already formed before crystallization such as in the process of FIG. 2. Crystallization can be carried out in an inert ambient or an oxidizing ambient. In embodiments where the conductive film 12 is above the active layer 11, it may be etched away completely or can be left in the source and drain areas for contact purposes. In one embodiment, the undoped silicon layer 11, and the doped silicon layer 12 (if present) are preferably patterned into islands to isolate devices.

Subsequently, as shown in FIG. 3B, a gate insulator layer 13 and a gate electrode layer are deposited. Since the gate electrode layer is conductive, the magnetic field crystallization process may be performed at this stage instead of at the earlier stage discussed above. In this case, if the furnace temperature during crystallization is high enough, the silicon island spacing may undesirably change. Also, since gate insulator materials used in TFTs generally have low thermal conductivity, the efficiency of heating an a-Si layer by the gate electrode would be low for a thick gate insulator layer.

In embodiments where the magnetic field crystallization process are performed at this stage or later in the fabrication process, the conductive film 12 is unnecessary. The basic TFT structure is completed by patterning the gate electrode layer to form gate electrode patterns 14, forming source-drain regions 15 by implantation of dopants into the undoped layer 11 (in embodiments where the doped layer 12 is entirely etched from above the undoped layer or when the doped layer 12 is not used), depositing an interlayer dielectric layer (ILD) 16, forming holes through the interlayer dielectric layer 16 and gate insulator layer 13, and forming source and drain electrodes 17 by metal deposition and patterning. Not all basic top gate coplanar TFT structure need an ILD layer 16, but when such a TFT structure is used as a part of a TFT array for display applications, an ILD layer may be needed to separate scan lines and data lines.

Some other applicable TFT structures that can be fabricated using the crystallization methods of the present invention include, but are not limited to, staggered TFTs and inverted co-planar TFTs. The staggered TFT structure is a flipped structure of the inverted staggered structure shown in FIG. 2A, meaning that source-drain electrodes are close to the substrate while the gate electrode is on the top of the structure.

Application to Short Channel Devices

For use in system on panel (SOP) displays, the circuit-TFTs need to have high speed which requires the use of short channel devices. For short-channel devices, when the channel size is comparable to or shorter than the poly silicon grain size, the TFT performance can be very non-uniform, because the number of grain boundaries within a TFT channel can vary from zero to one or even two. The crystallization methods of the present invention can be applied to precisely control the number of grain boundaries within a channel. This approach is described below.

An a-Si film is deposited as shown in FIG. 4. The areas on either side of the channel are then doped by ion implantation or ion doping as shown in FIG. 4A or FIG. 4B or a doped gas phase amorphous silicon layer, or a doped microcrystalline silicon layer or any other conducting layer is formed on top of the a-Si film as shown in FIG. 4C. In the figures, 20 represents conducting regions, while 21 represents undoped a-Si regions.

The conductive film may be above or below the a-Si film and it may be in direct contact with the a-Si film or be separated from the a-Si film by an intermediate layer. Upon applying the magnetic field, the doped layers or any other conducting layers are heated and begin to crystallize the channel a-Si layer in thermal contact with them by heat transfer. The crystal grains grow laterally and meet in the middle of the two conducting regions, resulting only in one grain boundary per TFT in the direction perpendicular to the current flow. If no grain-boundary perpendicular to the current is desired in a channel, the conducting region must be used only on one side of the channel. The lateral crystal growth time depends upon the channel length. The crystallization thermal budget can be further reduced if annealing is performed in an oxidizing ambient at normal or higher pressure.

Figure 4A:
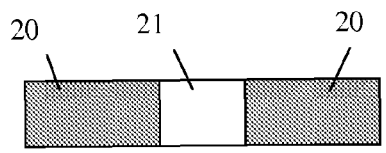
FIG. 4A shows a schematic for crystallization of a-Si by lateral growth by dividing a long channel into multiple short channels.
Figure 4B:
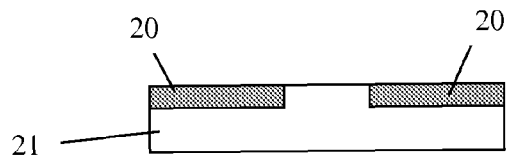
FIG. 4B show another schematic for crystallization of a-Si by lateral growth by dividing a long channel into multiple short channels.
Figure 4C:
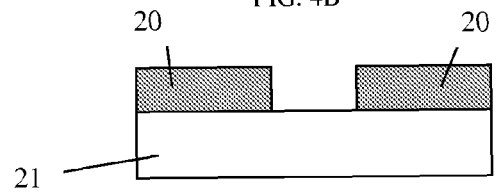
FIG. 4C show another schematic for crystallization of a-Si by lateral growth for application to short channel devices.
Figure 4D:
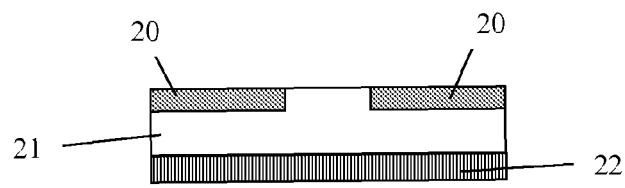
FIG. 4D shows another schematic for crystallization of a-Si by lateral growth by dividing a long channel into multiple short channels.

A second conducting layer 22 may also be used as shown in FIG. 4D to aid the lateral crystallization process. The second conducting layer 22 may be on the top or on the bottom, and may be in direct contact with the a-Si layer or may be separated by an intermediate layer (not shown). It is particularly helpful to have region 20 in FIG. 4D be doped. The doped films crystallize faster (especially boron doped films) and act as seeds for lateral crystallization.

Figure 5A:
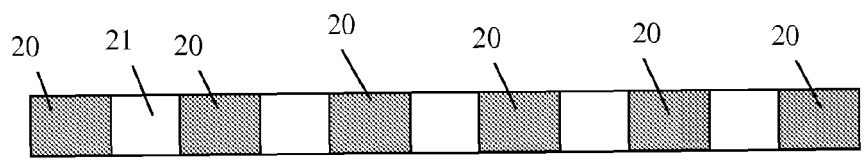
FIG. 5A show a schematic for crystallization of a-Si by lateral growth by dividing a long channel into multiple short channels.
Figure 5B:
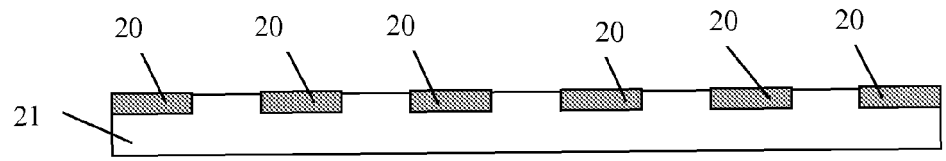
FIG. 5B show another schematic for crystallization of a-Si by lateral growth by dividing a long channel into multiple short channels.
Figure 5C:
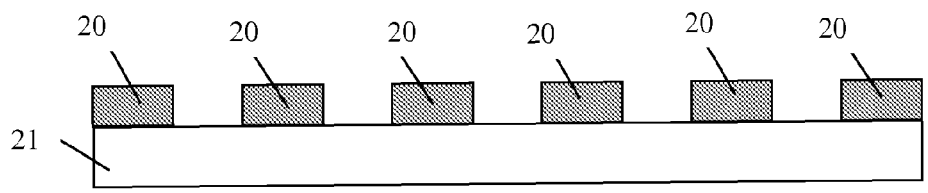
FIG. 5C show another schematic for crystallization of a-Si by a lateral growth by dividing a long channel into multiple short channels.

Although circuit TFTs require short-channel TFTs for obtaining high speed as was mentioned above, pixel TFTs generally need longer channels and both types of TFTs need to be formed on the same substrate at the same reduced crystallization thermal budgets. When the above approach is used for crystallizing the active regions of a pixel TFT, the active region can not be fully crystallized as generally pixel-TFT channel lengths are much longer than circuit-TFT channel lengths. The active regions in the pixel-TFTs can be simultaneously crystallized with the active regions in circuit- TFTs, if the channel areas of the pixel TFTs are completely covered by a conducting layer as in FIG. 1. The conducting layer may be in direct contact with a-Si or be separated by an intermediate layer and may be above or below the a-Si layer. Another alternative is to divide the pixel-TFT channels into several short channels of the same lengths as those in the circuit TFTs as shown in FIGS. 5A, 5B and 5C. Upon annealing, the active regions in circuit-TFTs and pixel-TFTs are simultaneously crystallized. The number of grain boundaries perpendicular to current flow in the pixel-TFTs will be more, however since the pixel-TFT speed is not very important, the higher number of grain boundaries in pixel TFTs is not a problem. Also, the number of grain boundaries per pixel TFTs would be same for all pixels, resulting in improved pixel to pixel uniformity. Such multi-channel TFTs also have better reliability as applied voltage between source and drain is divided into several small biases.

Applications to Solar Cells

Polycrystalline silicon solar cells are devices which can also employ the crystallization techniques of the present invention during fabrication.

Figure 6:
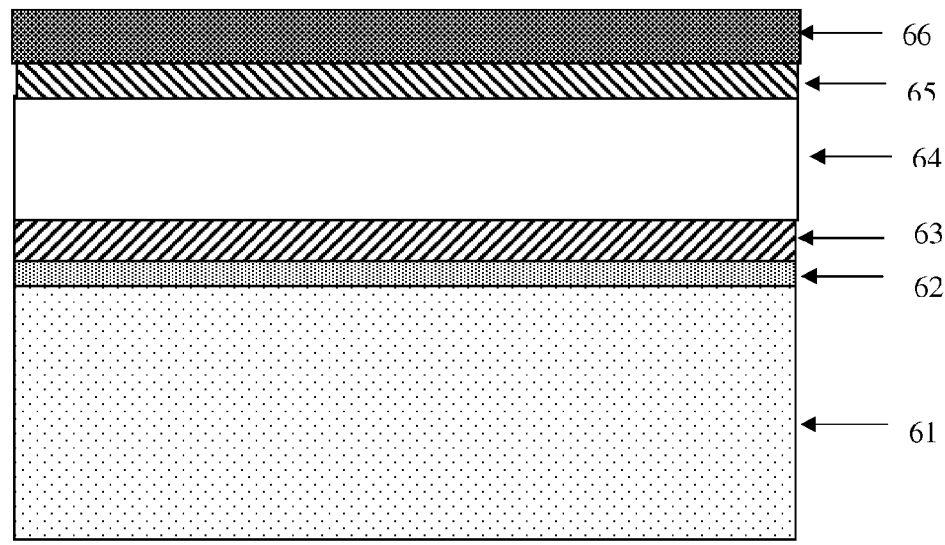
FIG. 6 shows a schematic of a solar cell structure with at least one silicon layer crystallized according to a method of the present invention.

FIG. 6 shows a cross-sectional schematic of a p-i-n type of solar cell or a photosensor. A transparent conductor 62 is deposited on a transparent substrate 61. In one embodiment, the transparent conductor 62 is indium tin oxide (ITO). The transparent substrate 61 is a substrate which can allow incident light such as solar radiation to pass through it. In one embodiment, the transparent substrate is glass. The transparent conductor 62 is termed the bottom electrode 62 herein. A p-type amorphous silicon or p-type microcrystalline silicon layer 63 is then deposited. The thickness of this layer 63, which also serves as a window to incoming radiation, would be preferably limited to several hundred angstroms, as thicker films will reduce the intensity of incoming radiation from reaching the intrinsic layer which is responsible for creating solar power. An intrinsic silicon (preferably an amorphous silicon layer) 64 is deposited on top of the p-type layer 63. This film is preferably several thousand angstroms to several microns thick.

An n-type amorphous or n-type microcrystalline silicon layer 65 is deposited on top of the intrinsic silicon layer 64. A top electrode 66, which is made from a material including, but not limited to, metal, is deposited. All the silicon (p-type, n-type and intrinsic) films may be crystallized by heating caused by a magnetic field using the methods of the present invention described herein. Heating by the magnetic field is more efficient due to the presence of conductor films in the structure, such as doped silicon films and the top and bottom electrode films. Additional heating may be supplied by heating the substrate in a resistively heated furnace or by lamps. If metal contamination is an issue, the heating can be done before the top electrode 66 is deposited. If a transparent electrode such as ITO can not be used as the bottom electrode 62 due to the possibility of heating damage to the transparent electrode during the crystallization process, a non-transparent electrode such as metal can be used as the bottom electrode 62. However, to allow the incident light to pass through, such an electrode must be patterned into grids or a transparent electrode can be formed on top and light can be incident from the top. In the current structure, the p-type silicon layer 63 is below the intrinsic silicon layer 64 and the n-type layer 65 is above the intrinsic silicon layer. However, it is also possible to use n-type silicon below the intrinsic silicon layer and p-type silicon above the intrinsic silicon layer.

Other structures where the above method may be applied include, but are not limited to, P-N junction solar cells and shotckey diode solar cells or photosensors. The P-N junction solar cell is similar to a P-I-N solar cell, except that there is no intrinsic layer (i-layer). The shotckey structures are preferably PI or NI structures, where P is p-type silicon, N is N-type silicon and I is intrinsic silicon. All these structures would need top and bottom electrodes for the current transport.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of crystallizing an undoped or a lightly doped amorphous silicon (a-Si) film comprising the steps of:
   a) forming the a-Si film on a glass substrate;
   b) forming a conductive film of doped amorphous silicon to form a stacked structure of the a-Si film and the conductive film on the glass substrate; and
   c) subjecting the stacked structure to a varying or an alternating magnetic field to heat the conductive film and to cause a crystallization of the a-Si film by heat transfer from the conductive film to the a-Si film.

2. The method of claim 1, further comprising the step of forming an intermediate layer between the a-Si film and the conductive film.

3. The method of claim 1, wherein crystallization of the a-Si film is aided by additional heating by a heating apparatus selected from the group consisting of a furnace, a lamp or a light source, and a combination of a furnace and a lamp or light source.

4. The method of claim 1, wherein the conductive film is formed continuously or discontinuously above, below, or both above and below the a-Si film.

5. The method of claim 1, wherein the conductive film has a conductivity of at least $10^{-3}$ S/cm.

6. The method of claim 1, wherein the conductive film comprises at least one layer selected from the group consisting of:
   a) a p-type doped amorphous silicon layer;
   b) a p-type doped microcrystalline silicone layer;
   c) an n-type doped amorphous silicon layer;
   d) an n-type doped microcrystalline silicon layer;
   e) a composite layer comprising at least one material from a) through d); and
   f) any combination of a) through e).

7. The method of claim 1, wherein the conductive film is formed by deposition by flowing dopant containing gases with silicon forming gases.

8. The method of claim 1, wherein the conductive film is formed by implanting dopant atoms into an a-Si layer.

9. The method of claim 1, wherein the conductive film is doped with at least one dopant selected from the group consisting of:
   a) B;
   b) P; and
   c) B and P.

10. The method of claim 1, wherein the conductive film has a dopant concentration of at least $10^{18}$ cm$^{-3}$.

11. The method of claim 1, wherein the conductive film has a dopant concentration of at least $10^{20}$ cm$^{-3}$.

12. The method of claim 1, further comprising the step of forming at least one intermediate layer between the conductive film and the a-Si film, wherein the intermediate layer comprises at least one layer selected from the group consisting of:
  a) at least one layer containing silicon oxide;
  b) at least one layer containing silicon nitride; and
  c) a combination of a) and b).

13. The method of claim 1, wherein a thickness of the conductive film is between 50 angstroms and 5000 angstroms.

14. The method of claim 2, wherein a thickness of the intermediate layer is between 10 angstroms and 5000 angstroms.

15. The method of claim 1, wherein an oxidizing ambient is used during the crystallization process.

16. The method of claim 1, wherein crystallization is carried out at an ambient at a pressure higher than 1 atmosphere.

17. A method of forming a TFT structure having a channel, a source, a drain and a gate, comprising the steps of:
  a) forming at least one gate electrode pattern on a glass substrate;
  b) depositing a gate insulator layer and an active layer of a-Si sequentially;
  c) forming a conductive layer of doped a-Si on the active layer;
  d) subjecting the structure to a varying or an alternating magnetic field to heat the conductive layer of doped a-Si to crystallize the active layer of a-Si by heat transfer from the conductive layer of doped a-Si to the active layer;
  e) patterning the conductive layer and the active layer to form a plurality of islands to isolate devices;
  f) depositing at least one source-drain electrode film;
  g) patterning the source-drain electrode film to form at least one source-drain pattern; and
  h) etching the conductive layer from above the active layer.

18. The method of claim 17, wherein steps a) through h) are performed sequentially, except that step d) is performed at a time selected from the group consisting of:
  a) after step e);
  b) after step f); and
  c) after step g).

19. The method of claim 17, wherein crystallization of the active layer is aided by additional heating by a heating apparatus selected from the group consisting of a furnace, a lamp or a light source, and a combination of a furnace and a lamp or light source.

20. The method of claim 17, wherein a conductivity of the conductive layer is at least $10^{-3}$ S/cm.

21. The method of claim 17, wherein the conductive layer has a doping concentration of at least $10^{18}$ cm$^{-3}$.

22. The method of claim 17, wherein the conductive layer has a doping concentration of at least $10^{20}$ cm$^{-3}$.

23. The method of claim 17, wherein the conductive layer is doped with at least one dopant selected from group consisting of:
  a) B;
  b) P; and
  c) B and P.

24. The method of claim 17, wherein an oxidizing ambient is used during the crystallization process.

25. A method of fabricating a coplanar top gate TFT structure having a channel, a source, a drain, and a gate comprising the steps of:
  a) forming an active layer of a-Si on a glass substrate;
  b) forming a conductive layer of doped a-Si on the active layer of a-Si;
  c) subjecting the structure to a varying magnetic field or an alternating magnetic field to heat the conductive layer of doped a-Si to crystallize the active layer of a-Si by heat transfer from the conductive layer of doped a-Si to the active layer;
  d) removing the conductive layer;
  e) patterning the active layer to form islands to isolate devices;
  f) forming a gate insulator layer;
  g) depositing a gate electrode layer and forming at least one gate electrode pattern;
  h) doping at least one source region and at least one drain region; and
  i) depositing a source and drain electrode layer, and forming at least one source and drain electrode pattern.

26. The method of claim 25, further comprising, before step a), the steps of:
  j) forming a continuous or patterned conductive film on the substrate, wherein the conductive film is either transparent or non-transparent; and
  k) forming a barrier layer on the conductive film;
  wherein, in step a), the a-Si layer is formed on the barrier layer.

27. The method of claim 25, wherein the conductive layer comprises at least one doped silicon layer having a dopant concentration of at least $10^{18}$ cm$^{-3}$.

28. The method of claim 25, wherein the conductive layer comprises at least one doped silicon layer having a dopant concentration of at least $10^{20}$ cm$^{-3}$.

29. The method of claim 25, further comprising the step of forming an intermediate layer between the active layer and the conductive layer.

30. The method of claim 25, wherein crystallization of the active layer of a-Si is aided by additional heating by a heating apparatus selected from the group consisting of a furnace, a lamp or a light source, and a combination of a furnace and a lamp or light source.

31. The method of claim 25, wherein crystallization of the active layer of a-Si is performed in the presence of an oxidizing ambient.

32. The method of claim 25, further comprising the step of forming a patterned inter-layer dielectric layer between steps h) and i).

33. A method of fabricating a coplanar top gate TFT structure having a channel, a source, a drain, and a gate comprising the steps of:
  a) forming a continuous or patterned conductive film on the substrate, wherein the conductive film is either transparent or non-transparent;
  b) forming a barrier layer on the conductive film;
  c) after steps a) and b), forming an active layer of a-Si on the substrate wherein, the active layer is formed on the barrier layer;
  d) patterning the active layer to form islands to isolate devices;
  e) forming a gate insulator layer;
  f) depositing a gate electrode layer;
  g) subjecting the structure to a varying magnetic field or an alternating magnetic field to heat the structure to cause crystallization of the active a-Si layer;
  h) patterning the gate electrode layer to form at least one gate electrode pattern;
  i) doping at least one source and drain region;
  j) depositing a source and drain electrode layer; and
  k) forming at least one source and drain electrode pattern.

34. The method of claim 33, wherein crystallization of the active layer is aided by additional heating by a heating apparatus selected from the group consisting of a furnace, a lamp or a light source, and a combination of a furnace and a lamp or light source.

35. The method of claim 33, wherein step g) is carried out after doping of source and drain regions in step i) or after any process step subsequent to step i).

36. The method of claim 33, further comprising the step of forming a patterned inter-layer dielectric layer between steps i) and j).

37. A method of crystallizing an a-Si layer comprising the steps of:
   a) forming on a glass substrate a structure having a stack of the a-Si layer and a plurality of discontinuous areas of a first conducting layer of doped a-Si or a structure with a plurality of discontinuous conducting regions of doped a-Si within the a-Si layer, where the first conducting layer is either directly in contact with the a-Si or the first conducting layer is separated from the a-Si layer by an intermediate layer; and
   b) subjecting the structure to a varying magnetic field or an alternating magnetic field to heat the first conducting layer or conducting regions to cause crystallization of the a-Si layer by lateral crystal growth in the a-Si layer starting from discontinuous areas of the first conducting layer or the conducting regions.

38. The method of claim 37, wherein crystallization of the a-Si layer is aided by additional heating by a heating apparatus selected from the group consisting of a furnace, a lamp or a light source, and a combination of a furnace and a lamp or light source.

39. The method of claim 37, wherein a second conducting layer of doped a-Si is continuously formed over or under the structure formed in step a), wherein the second conducting layer is in contact with the structure formed in step a) or it is separated from the structure formed in step a) by an intermediate layer.

40. The method of claim 37, wherein step b) is carried out in the presence of an oxidizing ambient.

41. A method of fabricating a coplanar top gate TFT structure having a channel, a source, a drain, and a gate comprising the steps of:
   a) forming a continuous or patterned conductive film on a substrate, wherein the conductive film is either transparent or non-transparent;
   b) forming a barrier layer on the conductive film;
   c) forming an active layer of a-Si on the barrier layer;
   d) subjecting the structure to a varying magnetic field or an alternating magnetic field to heat the conductive layer to crystallize the active layer of a-Si by heat transfer from the conductive layer to the active layer;
   e) patterning the active layer to form islands to isolate devices;
   f) forming a gate insulator layer;
   g) depositing a gate electrode layer and forming at least one gate electrode pattern;
   h) doping at least one source region and at least one drain region; and
   i) depositing a source and drain electrode layer, and forming at least one source and drain electrode pattern.

42. The method of claim 41, wherein the conductive film is a continuous, unpatterned film comprising a transparent conductor.

43. The method of claim 41, wherein crystallization of the a-Si layer is aided by additional heating by a heating apparatus selected from the group consisting of a furnace, a lamp or a light source, and a combination of a furnace and a lamp or light source.

44. A method of crystallizing an undoped or a lightly doped amorphous silicon (a-Si) film comprising the steps of:
   a) forming a stacked structure of the a-Si film and a conductive film on a glass substrate;
   b) subjecting the stacked structure to a varying or an alternating magnetic field to heat the conductive film and to cause the crystallization of the a-Si film by heat transfer from the conductive film to the a-Si film; and
   c) removing the conductive film completely or in a patterned form after the crystallization of the a-Si film;
   wherein the conductive film is formed from a material non-reactive with silicon up to the temperature of crystallization of the a-Si film.

45. The method of claim 44, further comprising the step of forming an intermediate layer between the a-Si film and the conductive film.

46. A method of fabricating a coplanar top gate TFT structure having a channel, a source, a drain, and a gate comprising the steps of:
   a) forming an active layer of a-Si on a glass substrate;
   b) forming a conductive layer of doped a-Si on the active layer of a-Si;
   c) subjecting the structure to a varying magnetic field or an alternating magnetic field to heat the conductive layer of doped a-Si to crystallize the active layer of a-Si by heat transfer from the conductive layer of doped a-Si to the active layer;
   d) removing the conductive layer in a patterned form, leaving it in a source and drain area of the TFT structure;
   e) patterning the active layer to form islands to isolate devices;
   f) forming a gate insulator layer;
   g) depositing a gate electrode layer and forming at least one gate electrode pattern; and
   h) depositing a source and drain electrode layer, and forming at least one source and drain electrode pattern.

47. The method of claim 1, further comprising the step of removing the conductive film completely after crystallization of the a-Si film.

48. The method of claim 1, further comprising the step of removing the conductive film in a patterned form after crystallization of the a-Si film.

49. The method of claim 17, wherein the conductive layer is formed discontinuously.

50. The method of claim 17, wherein the conductive layer is formed continuously.

* * * * *